(12) United States Patent
Zhu et al.

(10) Patent No.: US 9,716,175 B2
(45) Date of Patent: Jul. 25, 2017

(54) QUASI-NANOWIRE TRANSISTOR AND METHOD OF MANUFACTURING THE SAME

(71) Applicant: Institute of Microelectronics, Chinese Academy of Sciences, Beijing (CN)

(72) Inventors: Huilong Zhu, Poughkeepsie, NY (US); Qingqing Liang, Lagrangeville, NY (US); Haizhou Yin, Poughkeepsie, NY (US); Zhijiong Luo, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/437,506

(22) PCT Filed: Nov. 27, 2012

(86) PCT No.: PCT/CN2012/085331
§ 371 (c)(1),
(2) Date: Apr. 22, 2015

(87) PCT Pub. No.: WO2014/063403
PCT Pub. Date: May 1, 2014

(65) Prior Publication Data
US 2015/0255594 A1 Sep. 10, 2015

(30) Foreign Application Priority Data
Oct. 23, 2012 (CN) .......................... 2012 1 0407807

(51) Int. Cl.
*H01L 29/78* (2006.01)
*H01L 29/66* (2006.01)
(Continued)

(52) U.S. Cl.
CPC ........ *H01L 29/785* (2013.01); *H01L 27/1203* (2013.01); *H01L 29/0673* (2013.01);
(Continued)

(58) Field of Classification Search
CPC ............ H01L 29/785; H01L 29/66795; H01L 29/7848; H01L 27/1203
See application file for complete search history.

(56) References Cited

U.S. PATENT DOCUMENTS 7,015,078 B1 3/2006 Xiang et al.
2002/0113288 A1* 8/2002 Clevenger ......... H01L 21/76264
257/513
(Continued)

FOREIGN PATENT DOCUMENTS

CN 1893079 A 1/2007

OTHER PUBLICATIONS

International Preliminary Report on Patentability issued Apr. 28, 2015 in International Application No. PCT/CN2012/085331.
(Continued)

*Primary Examiner* — Fei Fei Yeung Lopez
(74) *Attorney, Agent, or Firm* — Pillsbury Winthrop Shaw Pittman LLP

(57) ABSTRACT

A quasi-nanowire transistor and a method of manufacturing the same are provided, the quasi-nanowire transistor comprising: providing an SOI substrate comprising a substrate layer (100), a BOX layer (120) and an SOI layer (130); forming a basic fin structure on the SOI layer, the basic fin structure comprising at least one silicon/silicon-germanium stack; forming source/drain regions (110) on both sides of the basic fin structure; forming a quasi-nanowire fin from a basic fin structure and an SOI layer thereunder; and forming a gate stack across the quasi-nanowire fin. The method can effectively control gate length characteristics. A semiconductor structure formed by the above method is also provided.

9 Claims, 8 Drawing Sheets

(51) Int. Cl.
   H01L 29/775    (2006.01)
   H01L 29/06     (2006.01)
   H01L 29/786    (2006.01)
   H01L 27/12     (2006.01)
   H01L 29/10     (2006.01)
   H01L 29/16     (2006.01)

(52) U.S. Cl.
   CPC .... *H01L 29/1054* (2013.01); *H01L 29/66439* (2013.01); *H01L 29/66795* (2013.01); *H01L 29/775* (2013.01); *H01L 29/7848* (2013.01); *H01L 29/78696* (2013.01); *H01L 29/16* (2013.01)

(56) References Cited

U.S. PATENT DOCUMENTS

| | | | | |
|---|---|---|---|---|
| 2004/0094804 A1* | 5/2004 | Amos | ............... | H01L 21/28097 257/369 |
| 2004/0227187 A1 | 11/2004 | Cheng et al. | | |
| 2005/0184316 A1* | 8/2005 | Kim | ................. | H01L 29/66795 257/213 |
| 2005/0258477 A1* | 11/2005 | Saito | ................. | H01L 21/28052 257/327 |
| 2006/0189043 A1* | 8/2006 | Schulz | ............. | H01L 29/42384 438/142 |
| 2006/0275988 A1* | 12/2006 | Yagishita | ........ | H01L 21/823431 438/275 |
| 2006/0289940 A1 | 12/2006 | Hyun et al. | | |
| 2007/0052041 A1* | 3/2007 | Sorada | ............. | H01L 29/66795 257/392 |
| 2011/0175152 A1* | 7/2011 | Booth, Jr. | ............. | H01L 21/845 257/306 |
| 2013/0056795 A1* | 3/2013 | Wu | ................... | H01L 29/66795 257/191 |

OTHER PUBLICATIONS

International Search Report and Written Opinion mailed on Aug. 1, 2013 in International Application PCT/CN2012/085331.

\* cited by examiner

QUASI-NANOWIRE TRANSISTOR AND METHOD OF MANUFACTURING THE SAME

CROSS REFERENCE TO RELATED APPLICATION

This application is a national stage application, filed under 35 U.S.C. §371, of PCT Application No. PCT/CN2012/085331, filed on Nov. 27, 2012, entitled "QUASI-NANOWIRE TRANSISTOR AND METHOD OF MANUFACTURING THE SAME", which claims priority to Chinese Application No. 201210407807.8, filed on Oct. 23, 2012, all of which are hereby incorporated by reference in their entirety.

TECHNICAL FIELD

The present invention relates to the field of semiconductor technology. In particular, the present invention relates to a quasi-nanowire transistor and a method of manufacturing the same.

BACKGROUND ART

As the channel length of Metal Oxide Semiconductor Field Effect Transistors (MOSFETs) continues to scale, a series of effects that can be neglected in the long-channel model of MOSFETs become more significant, and even become the dominant factor that affects the performance. Such phenomenon is generally referred to as short channel effect. Short channel effect leads to the deterioration of the electrical properties of the device, e.g., leading to problems such as reduction of the gate threshold voltage, increase in power consumption, and signal-to-noise ratio (SNR) decline.

In order to improve short channel effect, the dominant idea in the industry is to improve the conventional planar-type device technology, to reduce the thickness of the channel region, and to eliminate the neutral layer that depletes the bottom of the layer in the channel, so that the depletion layer in the channel can fill the entire channel region, namely, the so-called Fully Depleted (FD) device, while conventional planar-type devices are Partially Depleted (PD) devices.

However, the manufacture of a fully depleted device requires the thickness of the silicon layer in the channel to be quite small. Traditional manufacturing processes, especially traditional bulk silicon-based processes can hardly manufacture structures that meet the requirements, or the cost is too high. Even for the emerging SOI (silicon on insulator) technology, the thickness of the channel silicon layer is also difficult to be controlled at a thin level. The focus of R & D has been shifted to 3D device structures to achieve a fully depleted device.

3D device structures (which are also referred to as vertical-type devices in some references) refer to structures where the cross sections of the source/drain regions and the gate of the device are not within the same plane, and substantially belong to FinFET (fin field effect transistor) structures.

After shifting to 3D device structures, since the channel region is separated from these structures rather than included in the bulk silicon or SOI, it is possible to manufacture a fully depleted channel with a very small thickness by means such as etching.

The 3D semiconductor device that has been proposed is illustrated in FIG. 1. The semiconductor device comprises: a fin 020 on an insulating layer 010; source/drain regions 030 connected to an opposite first side 022 in the fin 020; a gate 040 located on a second side 024 adjacent to the first side 022 in the fin 020 (the gate dielectric layer and the work function metal layer sandwiched between the gate 040 and the fin 020 are not shown in the figure). In order to reduce the resistance of the source/drain regions, the edge portion of the source/drain regions 030 can be extended, i.e., the width of the source/drain regions 030 (along the xx' direction) is greater than the thickness of the fin 020. The 22 nm technology node and below is expected to be applied to the 3D semiconductor structures. As the device dimension further shrinks, the short channel effect of 3D semiconductor devices will also become a major factor that affects the device performance.

As a 3D semiconductor device, nanowire MOSFET can control the short channel effect effectively and has a low random dopant fluctuation, and therefore is promising for the future further scaled-down MOSFET. However, the nanowire device manufacturing process is very difficult currently.

SUMMARY OF THE INVENTION

One aspect of the present invention is to provide a quasi-nanowire transistor and a method of manufacturing the same, which can control gate length characteristics effectively, e.g., gate length and the alignment of the bottom and the top. In addition, the high-k gate dielectric and the metal gate can be integrated into the quasi-nanowire transistor to enhance performance of semiconductor devices. Further, another aspect of the present invention is to provide a strained source/drain regions having stress in a quasi-nanowire transistor.

According to one aspect of the present invention, there is provided a method of manufacturing a semiconductor structure, comprising:

Step S101, providing an SOI substrate comprising a substrate layer, a BOX layer and an SOI layer;

Step S102, forming a basic fin structure on the SOI layer, the basic fin structure comprising at least one silicon/silicon-germanium stack;

Step S103, forming source/drain regions on both sides of the basic fin structure;

Step S104, forming a quasi-nanowire fin by the basic fin structure and the SOI layer thereunder; and Step S105, forming a gate stack across the quasi-nanowire fin.

Correspondingly, the present invention further provides a semiconductor structure comprising:

an SOI substrate, comprising an SOI layer, a BOX layer and a substrate layer;

a fin formed by a portion of the SOI layer and at least one silicon/silicon-germanium stack thereon;

source/drain regions located on both sides of the fin and extending in the width direction, wherein the fin is located in a trench formed by the extended source/drain regions, and a spacer is formed on a portion of the source/drain regions unconnected to the fin;

a gate dielectric layer covering the fin; and a gate metal layer covering the gate dielectric layer.

In the quasi-nanowire transistor and a method of manufacturing the same provided by the present invention, source/drain regions are firstly formed and then a quasi-nanowire fin is formed, which can control gate length characteristics effectively, e.g., gate length and the alignment of the bottom and the top. In addition, the high-k gate dielectric and the metal gate can be integrated into the quasi-nanowire transistor to reduce short channel effects of devices, thereby facilitating improvement of performance of semiconductor devices. Further, the strained source/drain regions formed depending on device types may apply different stress to the quasi-nanowire fin according to the device types, thereby increasing mobility of channel carriers.

BRIEF DESCRIPTION OF THE FIGURES

By reading the detailed description of the non-limiting embodiments made with reference to attached drawings, the other features, objects and advantages of the present invention will become more apparent.

The following cross-sectional views are obtained by cutting the formed structures along the cross-section line (AA' or 11") given in the corresponding top view.

The same or similar reference numbers in the drawings represent the same or similar parts.

DESCRIPTION OF THE PREFERRED EMBODIMENTS

Figure 1:
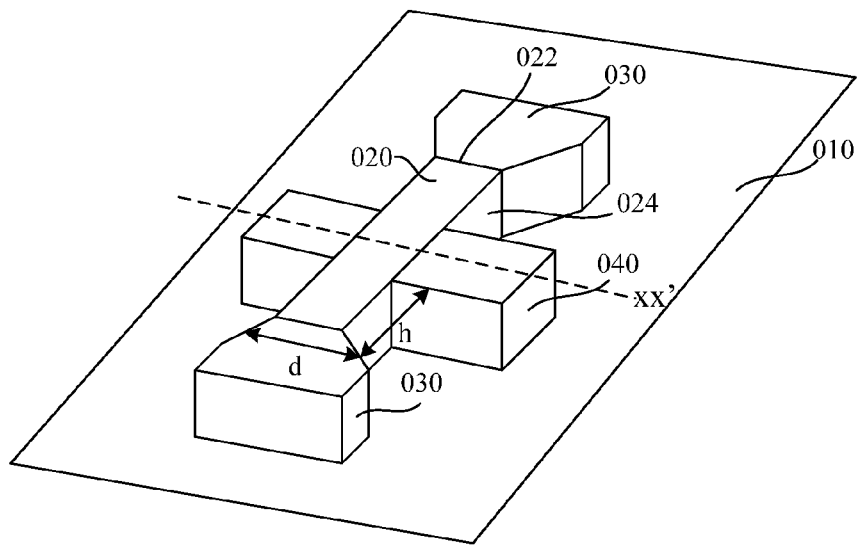
FIG. 1 is a schematic view of the fin field effect transistor in the prior art.
Figure 2:
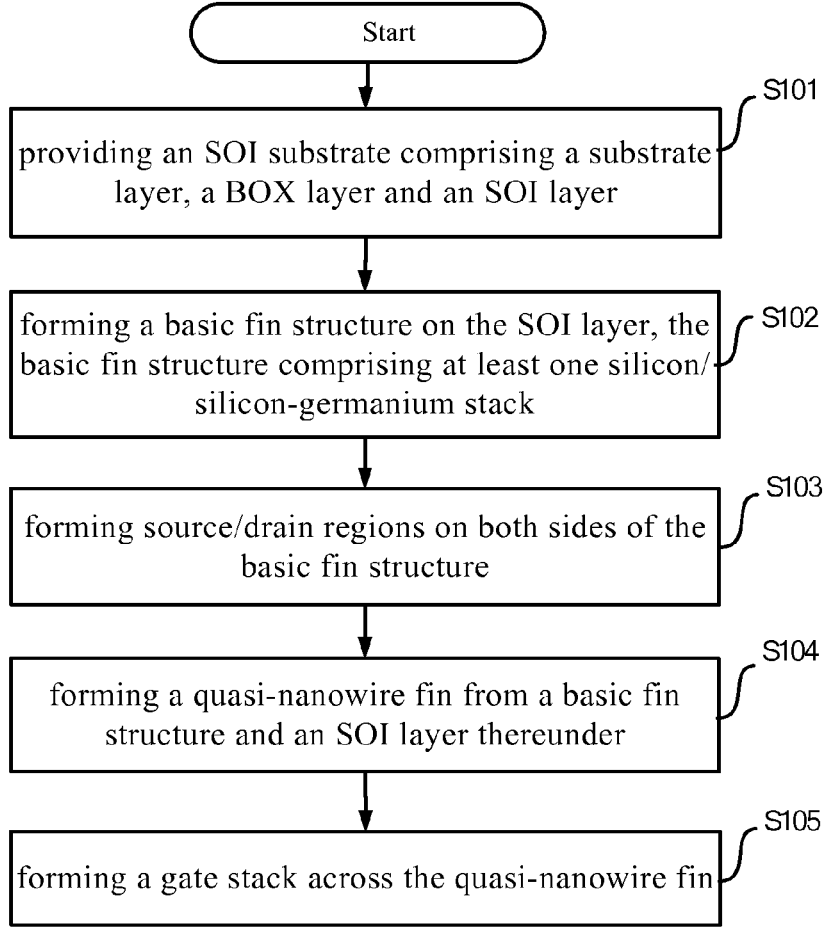
FIG. 2 is a flowchart of an embodiment of the method for manufacturing a quasi-nanowire transistor of the invention.

To make the objects, technical solutions and advantages of the present invention more clear, the embodiments of the present invention will be described in detail with reference to the drawings.

The embodiments of the present invention are described below in detail and the illustrative examples of the embodiments are shown in the drawings, wherein the same or similar reference numbers denote the same or similar elements or components having the same or similar functions throughout the drawings. The embodiments described with reference to drawings are exemplary, which are used for explaining the present invention only, and cannot be construed as limiting the present invention.

The following disclosure provides many different embodiments or examples used to achieve different structures of the present invention. In order to simplify the disclosure of the present invention, members of examples and arrangements thereof will be described hereinafter. Of course, they are merely exemplary, and are not intended to limit the present invention. In addition, numbers and/or letters in the present invention can be repeated in different examples. Such repetition is for the purpose of simplification and clarity, and does not indicate the relationship between the various embodiments and/or settings discussed. Further, the present invention provides examples of a variety of processes and materials, but those skilled in the art may be aware of the applicability of other processes and/or the use of other materials. In addition, the structure where the first feature is "above" the second feature described below may include an embodiment where the first and second features are formed as a direct contact, and may also include an embodiment where additional features are formed between the first and second features, so that the first and second features may not be in direct contact. It should be noted that the parts illustrated in the drawings are not necessarily drawn to scale. The present invention omits the description of well-known components and processing technologies and processes to avoid unnecessarily limiting the present invention.

The method for manufacturing a quasi-nanowire transistor provided in the present invention includes:

Step S101, providing an SOI substrate comprising a base layer, a BOX layer and an SOI layer;

Step S102, forming a basic fin structure on the SOI, the basic fin structure comprising at least one silicon/silicon-germanium stack;

Step S103, forming source/drain regions (110) on both sides of the basic fin structure;

Step S104, forming a quasi-nanowire fin from a basic fin structure and an SOI layer thereunder; and Step 105, forming a gate stack across the quasi-nanowire fin.

Hereinafter with reference to FIGS. 2 to 17 and combined with an embodiment of the method for manufacturing a semiconductor structure provided in the present invention, the various steps are further elaborated.

Figure 3:
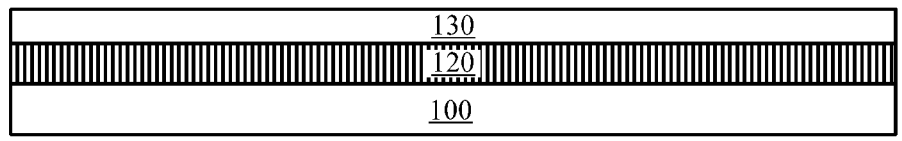
FIG. 3 illustrates a cross-sectional view of the substrate used in an embodiment of the method for manufacturing a quasi-nanowire transistor of the invention.

Step S101, as shown in FIG. 3, there is provided an SOI substrate having at least a three-layer structure, which are a substrate layer 100 (e.g., a bulk silicon layer, wherein FIG. 3 only shows a part of the substrate layer 100), a BOX layer 120 on the substrate layer 100, and an SOI layer 130 covering the BOX layer 120, respectively. The material of the BOX layer 120 may be $SiO_2$, and the BOX layer 120 may have a thickness greater than 100 nm; and the material of the SOI layer 130 is monocrystalline silicon, germanium or Group III-V compound (such as silicon carbide, gallium arsenide, indium arsenide or indium phosphide, etc.). The SOI substrate in the present embodiment is one having an ultrathin SOI layer 130. Thus, the thickness of the SOI layer 130 can be in the range of 5 nm to 20 nm, for example, 5 nm, 13 nm or 20 nm. Preferably, the crystal orientation of the SOI layer is <100>.

The step S102 is performed, wherein a basic fin structure comprising at least one silicon/silicon-germanium stack is formed on the SOI layer. In this embodiment, a basic fin structure having a certain length is formed on the SOI layer, the basic fin structure comprising at least one silicon/silicon-germanium stack and being covered with a first dielectric layer.

Figure 4:
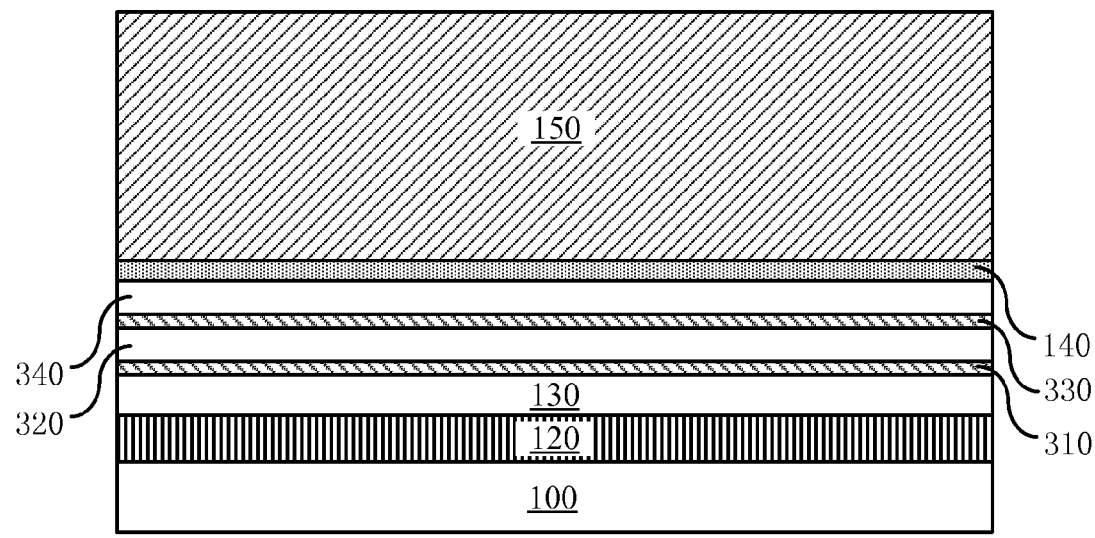
FIG. 4 illustrates a cross-sectional view of the substrate used after forming various material layers required for manufacturing a quasi-nanowire transistor on the substrate in an embodiment of the method for manufacturing a quasi-nanowire transistor of the invention.

As shown in FIG. 4, at least one silicon/silicon-germanium stack, a third dielectric layer 140 and a first dielectric layer 150 are sequentially formed on the SOI substrate. The at least one silicon/silicon-germanium stack comprises, for example, a first silicon/silicon-germanium stack (a first silicon-germanium layer 310 and a first silicon layer 320), and a second silicon/silicon-germanium stack (a second silicon-germanium layer 330, and a second silicon layer 340). More or less silicon/silicon-germanium stacks can be comprised. The at least one silicon/silicon-germanium stack, a third dielectric layer 140 and a first dielectric layer 150 can be sequentially formed on the SOI layer 130 by Chemical Vapor Deposition (CVD), high-density plasma CVD, Atomic Layer Deposition (ALD), Plasma Enhanced Atomic Layer Deposition (PEALD), Pulse Laser Deposition (PLD), or other suitable methods. The first silicon-germanium layer 310 and the second silicon-germanium layer 330 may have a thickness in the range of about 1 to 3 nm, and the silicon-germanium material may have 5%-10% germanium. The first silicon layer 320 and the second silicon layer 340 may have a thickness in the range of 5 to 20 nm. The material of the third dielectric material 140 may be, for example, $SiO_2$, with a thickness between 2 nm and 5 nm, e.g., 2 nm, 4 nm, or 5 nm. The material of the first dielectric layer 150 may be $Si_3N_4$, with a thickness between 50 nm and 150 nm, e.g., 50 nm, 100 nm, or 150 nm.

Figure 5:
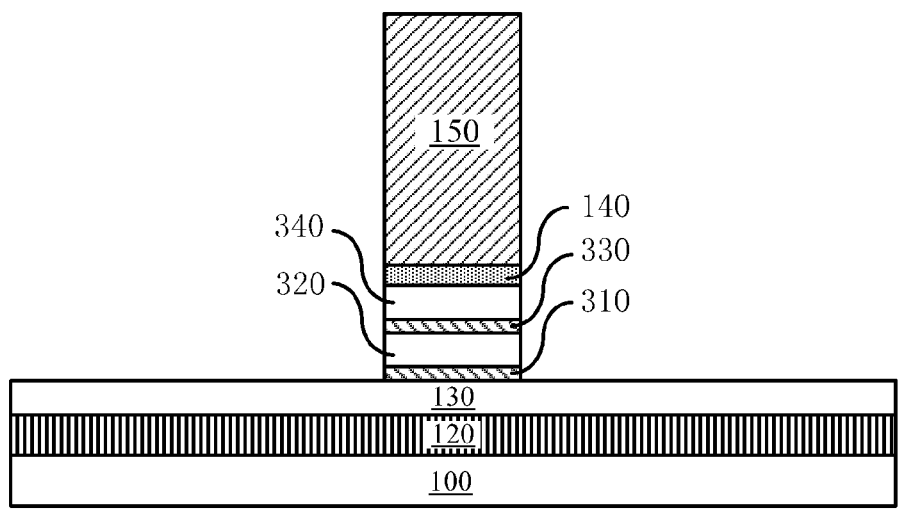
FIG. 5 illustrates a cross-sectional view after etching the semiconductor structure illustrated in FIG. 4.

For example, photoresist pattern is applied on the first dielectric layer 150, where the pattern of the photoresist corresponds to that of the basic fin structure, for example, a strip having a length extending in the width direction of the semiconductor structure (the horizontal direction as shown in various sectional views is a longitudinal direction, and the direction perpendicular to the paper sheet is a width direction; and the longitudinal direction corresponds to the longitudinal direction of the basic fin structure, the fin structure to be formed and the semiconductor device channel). Therefore, the patterned photoresist layer is used as a mask to etch the first dielectric layer 150, the third dielectric layer 140, the at least one silicon/silicon-germanium stack (comprising, for example, a second silicon layer 340, a second silicon-germanium layer 330, a first silicon layer 320, a first silicon-germanium layer 310), and the etching stop at the top of the SOI layer 130 to form a shape having higher middle portion and lower side portions, as shown in FIG. 5. In other embodiments, a portion of the SOI layer 130 can also be removed by etching, as long as a portion of the SOI layer 130 remains. Herein the projected portion of the semiconductor material (including a silicon-germanium layer and a silicon layer) formed by etching is refered as a basic fin structure, which is covered with a third dielectric layer 140 and a first dielectric layer 150. As described below, the basic fin structure is used in the subsequent steps to form a fin of a quasi-nanowire transistor. The etching process has many choices, for example, plasma etching can be employed.

In other embodiments, a first dielectric layer 150 and a third dielectric layer 140 may not be formed.

Step S103 is performed to form source/drain regions on both sides of the basic fin structure. In this embodiment, source/drain regions 110 are formed on both sides of the basic fin structure in the longitudinal direction, and the source/drain regions are covered with a second dielectric layer 160, wherein the material of the second dielectric layer is different from that of the first dielectric layer. After the above etching steps, epitaxial growth is performed on the SOI layer 130 of the SOI substrate to form source/drain regions 110. The source/drain regions 110 are slightly higher than the upper surface of the third dielectric layer 140. For example, the source/drain regions 110 may be source/drain regions made of stress materials. For example, for PMOS devices, the material of the source/drain regions 110 may be $Si_{1-x}Ge_x$ (X may range from 0.15 to 0.75, and can be flexibly adjusted according to the process requirements, such as 0.15, 0.3, 0.4, 0.5 or 0.75; and the values of X may be determined as described above if not indicated otherwise, and detailed description thereof is omitted herein). For NMOS devices, the material of the source/drain regions 110 may be Si:C (the percentage of the number of C atom may be 0.5% to 2%, such as 0.5%, 1% or 2%, and the content of C atom can be flexibly adjusted according to the process requirements; the values of the percentage of the number of C atom may be determined as described above if not indicated otherwise, and detailed description thereof is omitted herein). The source/drain regions 110 may be in-situ doped during the process of growth, and/or the source/drain regions 110 may be ion implanted and annealed to activate the dopants. For PMOS devices, ions of B may be implanted. For NMOS devices, ions of As or P may be implanted. The source/drain regions 110 may further adjust the stress of the basic fin structure, thereby adjusting the stress within the fin to be subsequently formed from a basic fin structure so as to enhance mobility of carriers in the channel region within the fin.

Figure 6:
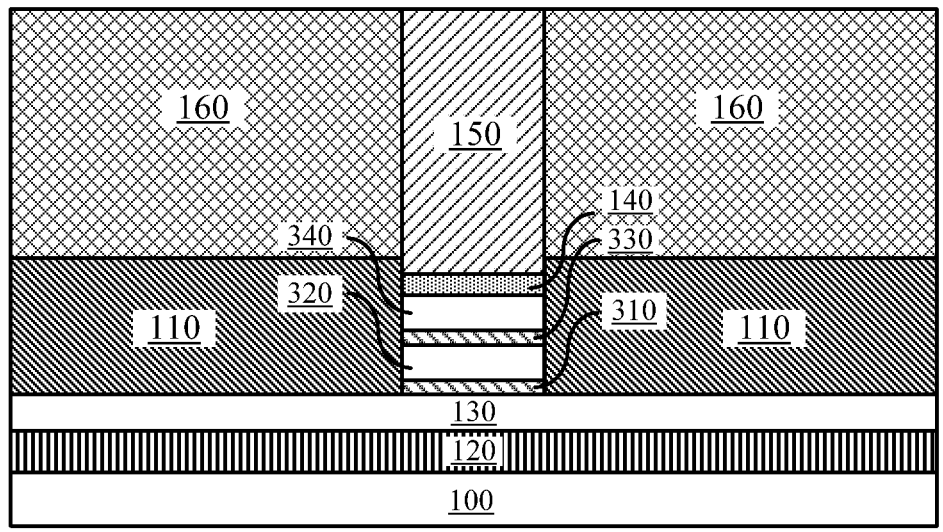
FIG. 6 illustrates a cross-sectional view after epitaxial growth and oxide deposition of the semiconductor structure illustrated in FIG. 5.

Then, a second dielectric layer 160 can be formed on the entire semiconductor structure. The material of the second dielectric layer is different from that of the first dielectric layer 150. For example, if the material of the first dielectric layer 150 is $Si_3N_4$, the second dielectric layer 160 may be an oxide layer. A second dielectric layer 160 can be formed by Chemical Vapor Deposition, High-density Plasma CVD, Atomic Layer Deposition, Plasma Enhanced Atomic Layer Deposition, Pulse Laser Deposition or other suitable methods. The material of the second dielectric layer 160 may be $SiO_2$. Planarization operation is performed after forming a second dielectric layer 160, and stops on the first dielectric layer 150. As shown in FIG. 6, a second dielectric layer 160 covering the source/drain regions 110 is formed, and the upper surface of the second dielectric layer 160 is flushed with that of the first dielectric layer 150.

In other embodiments, the second dielectric layer 160 may not be formed.

Figure 7:
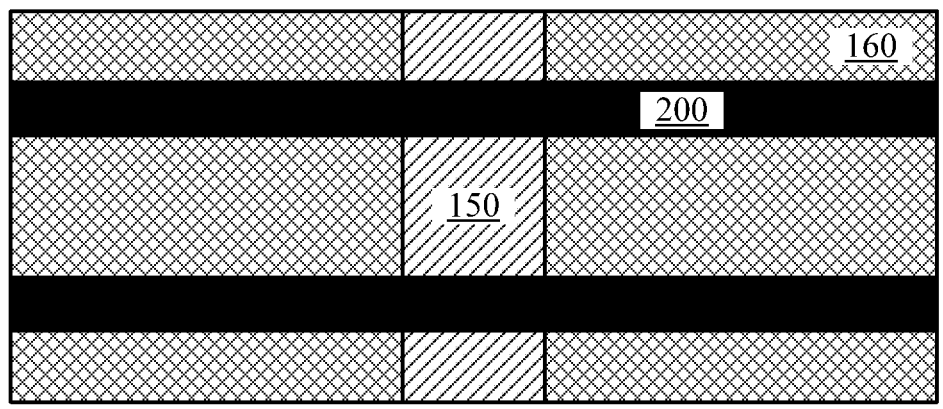
FIG. 7 illustrates a cross-sectional view upon forming a photoresist pattern on the semiconductor structure illustrated in FIG. 6.

Step S104 is performed, wherein a quasi-nanowire fin is formed by a basic fin structure and an SOI layer thereunder. In this embodiment, source/drain regions 110 on both sides of the basic fin structure in the longitudinal direction and a fin structure in the trench constituted by the second dielectric layer 160 along the longitudinal direction are formed from a basic fin structure and an SOI layer thereunder. For example, a photoresist layer 200 may be formed on the semiconductor structure, and patterning can be carried out by, for example, spin coating, exposure and development, and the region where a fin is intended to be formed is protected, as shown in FIG. 7. The material of the photoresist layer can be a vinyl monomer material, a material containing an azide quinone compound or a polyethylene monolaurate material.

Figure 8:
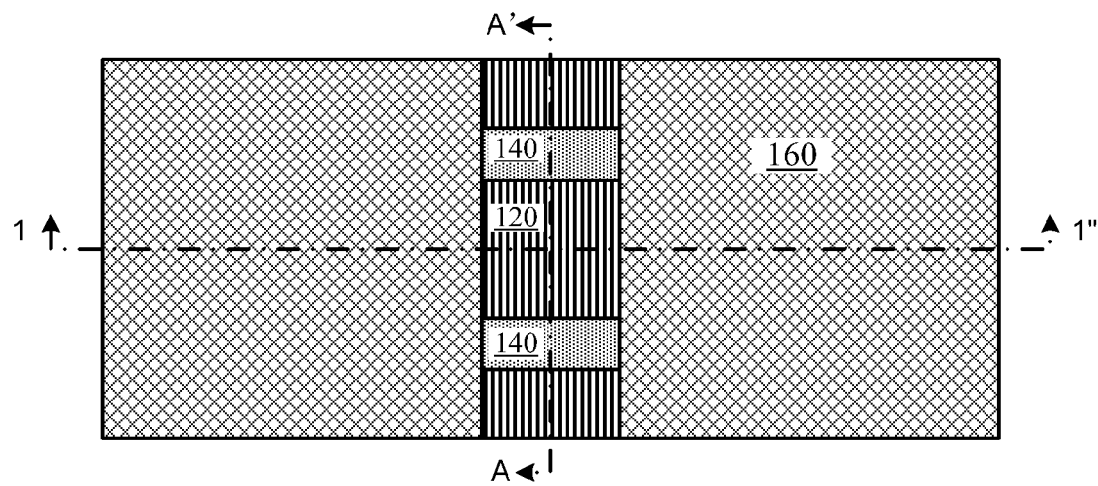
FIG. 8 illustrates a cross-sectional view after etching the semiconductor structure illustrated in FIG. 7.
Figure 9:
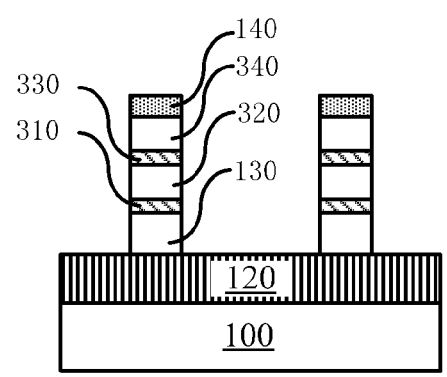
FIG. 9 illustrates a cross-sectional view of the semiconductor structure illustrated in FIG. 8 along the line A-A'.
Figure 10:
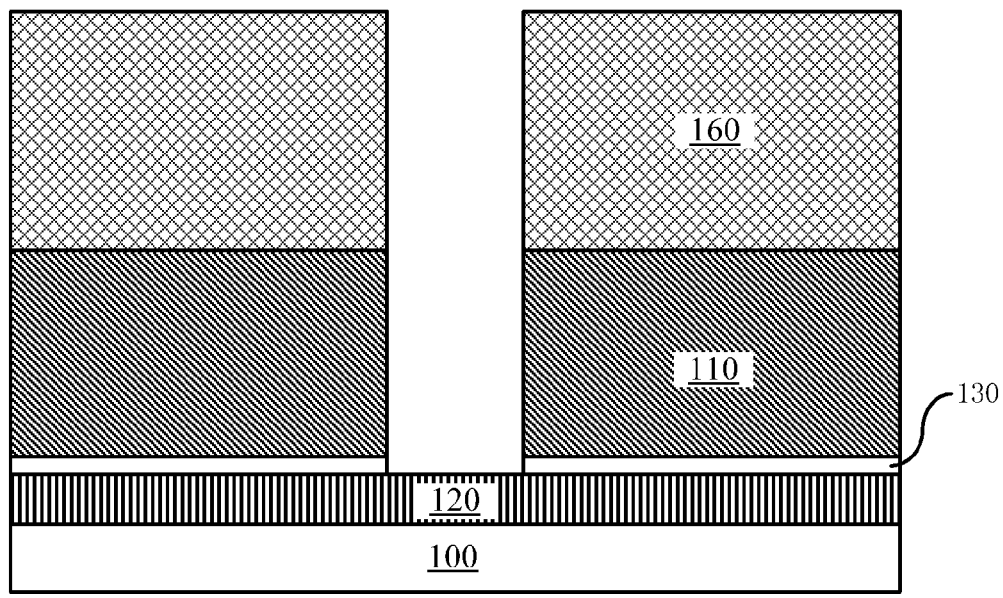
FIG. 10 illustrates a cross-sectional view of the semiconductor structure illustrated in FIG. 8 along the line 1-1"

The patterned photoresist layer 200 is used as a mask to etch the first dielectric layer 150, the third dielectric layer 140, the second silicon layer 340, the second silicon-germanium layer 330, the first silicon layer 320, the first silicon-germanium layer 310 and the SOI layer 130, and the etching may stop on the upper surface of the BOX layer 120. Then the photoresist layer 200 and the first dielectric layer 150 thereunder may be removed, stopping on the upper surface of the third dielectric layer 140, as shown in FIG. 8, FIG. 9, and FIG. 10, thus forming source/drain regions 110 on both sides and a fin of a fin structure quasi-nanowire transistor extending along the longitudinal direction in the trench constituted by a second dielectric layer 160.

Figure 11:
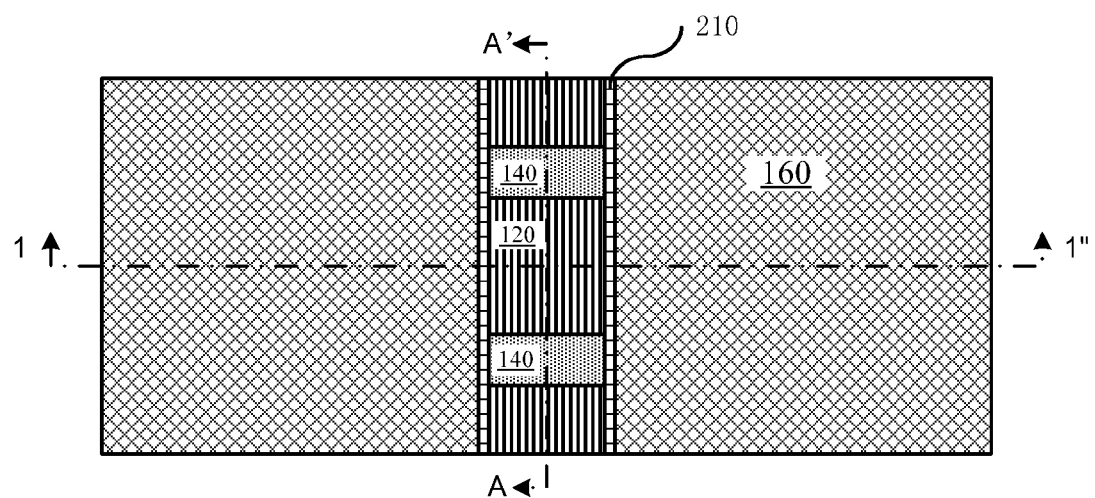
FIG. 11 illustrates a cross-sectional view when the semiconductor structure illustrated in FIG. 8 forms a spacer.
Figure 12:
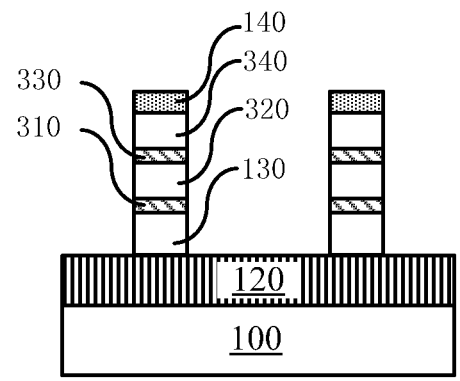
FIG. 12 illustrates a cross-sectional view of the semiconductor structure illustrated in FIG. 11 along the line A-A'.
Figure 13:
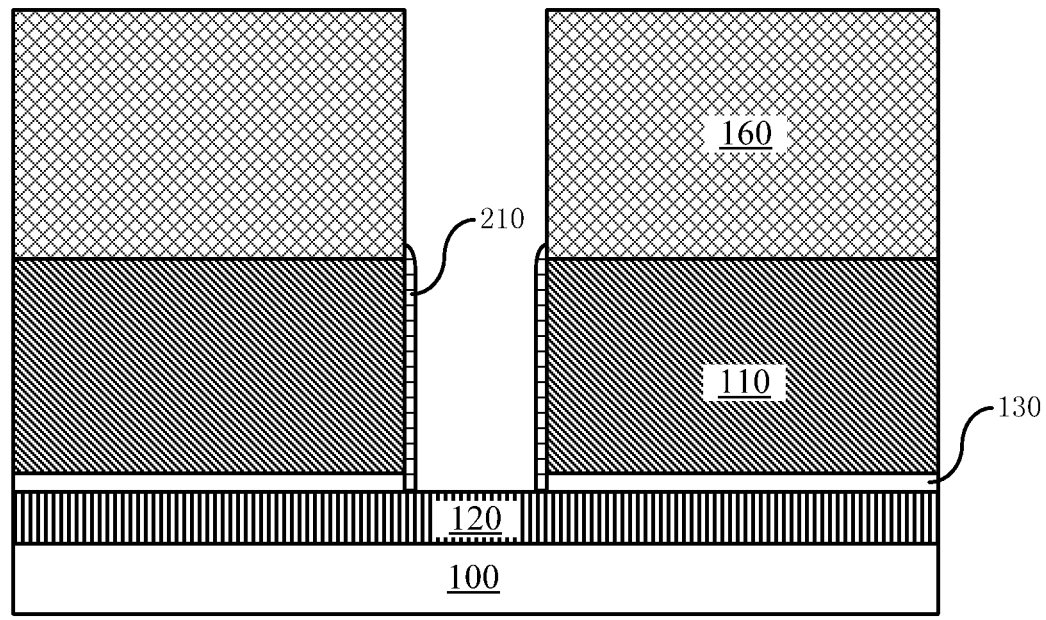
FIG. 13 illustrates a cross-sectional view of the semiconductor structure illustrated in FIG. 11 along the line 1-1"
Figure 14:
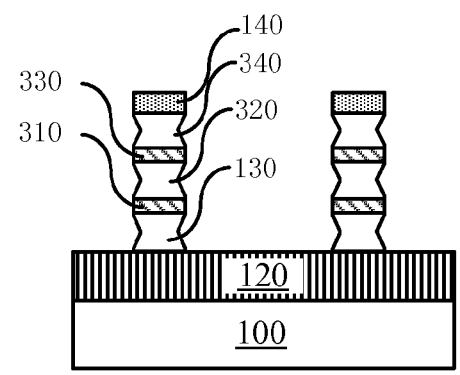
FIG. 14 illustrates a cross-sectional view after the fin in the semiconductor structure illustrated in FIG. 12 is etched.

In this embodiment, there is also a need to form a spacer 210 on the SOI layer 130 exposed in the trench and the sidewalls of the source/drain regions 110. A spacer 210 is formed on both sides of the source/drain regions 110, as shown in FIGS. 11, 12 and 13. The spacer 210 can be formed by silicon nitride, silicon oxide, silicon oxynitride, silicon carbide, or any combination thereof, and/or other suitable materials. The spacer 210 may be a multilayer structure. The spacer 210 may be formed by a process comprising deposition and etching, and its thickness can range from 5 nm to 10 nm, for example, 5 nm, 8 nm, or 10 nm. The spacer 210 is at least higher than the source/drain regions 110. The spacer 210 is not formed on the fin structure.

Optionally, after a spacer 210 has been formed, the fin may be etched such that the cross-section of the sidewalls forms a serrated shape. For example, in the case that the crystal orientation of the SOI layer is <100>, the first silicon layer 320, the second silicon layer 340 and the SOI layer 130 can be wet etched with tetramethyl ammonium hydroxide (TMAH) or KOH by controlling the orientation of the basic fin structure. Since the SOI layer 130, the first silicon-germanium layer 310, the first silicon layer 310, the second silicon-germanium layer 330, the second silicon layer 340 and the third dielectric layer 140 are sequentially arranged in the fin, the silicon-germanium layer and the third dielectric layer 140 are not etched when etching the silicon layer. Since the etching is performed along the {111} crystal plane of the silicon layers, the cross-section of the formed fin has a serrated shape. The crystal orientation on the surface of the silicon layer at the sidewalls of the fin is <111>.

The fins having a serrated cross-section have a larger sidewall area than conventional fins, which may increase the width of the channel region.

Figure 15:
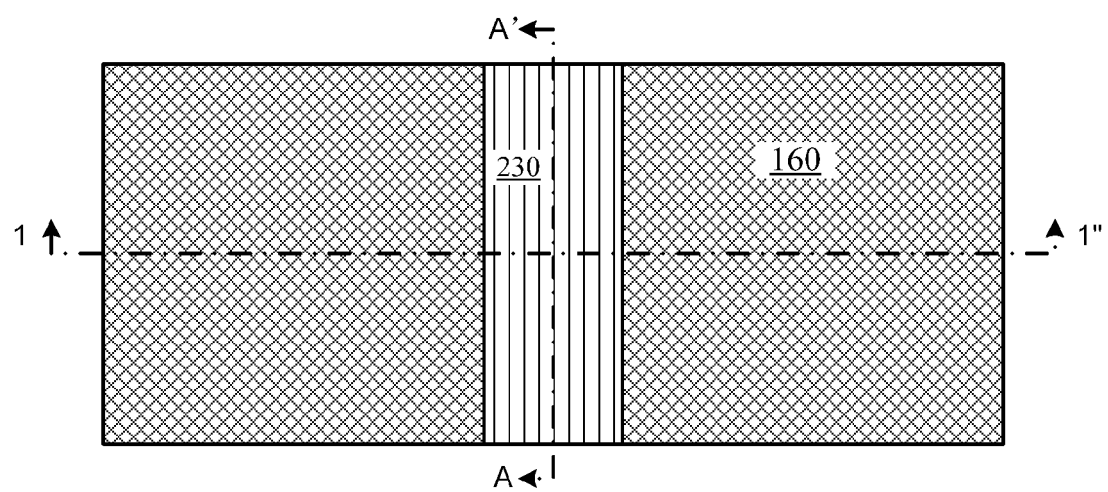
FIG. 15 illustrates a cross-sectional view when the semiconductor structure illustrated in FIG. 14 forms a metal layer.
Figure 16:
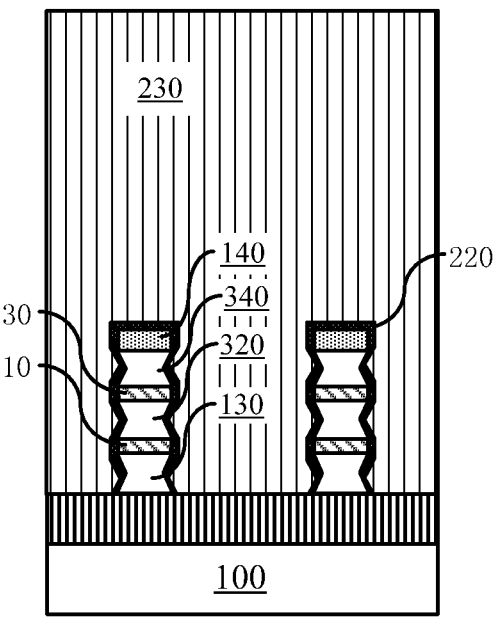
FIG. 16 illustrates a cross-sectional view of the semiconductor structure illustrated in FIG. 15 along the line A-A'.
Figure 17:
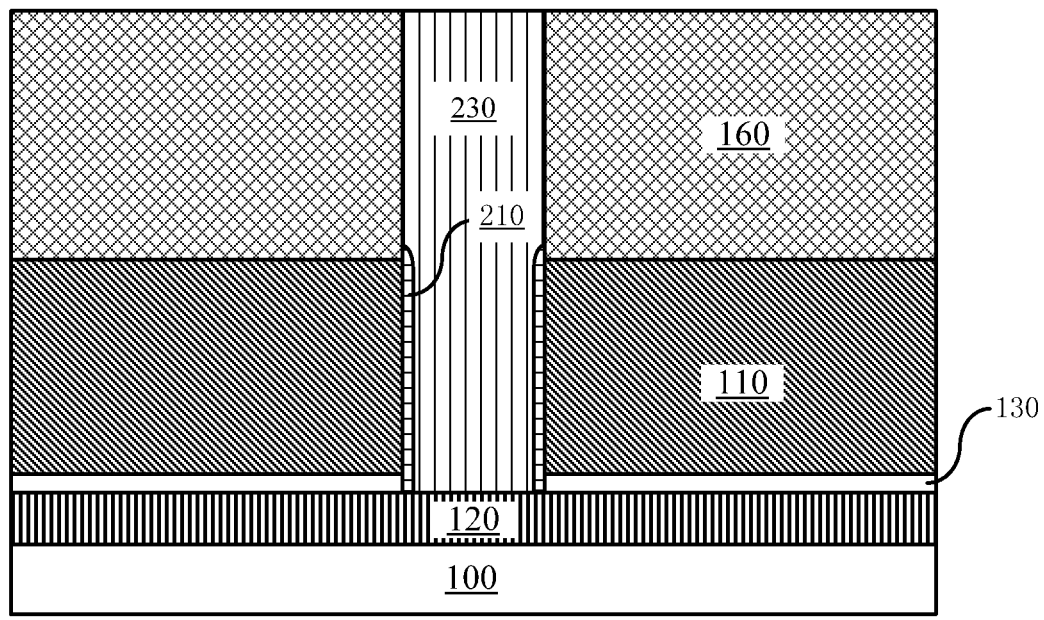
FIG. 17 illustrates a cross-sectional view of the semiconductor structure illustrated in FIG. 15 along the line 1-1".

Step S105 is performed to form a gate stack across the quasi-nanowire fin. In this embodiment, a gate dielectric layer 220 covering the fin structure and a gate metal layer 230 covering the gate dielectric layer 220 are formed in the trench. The gate dielectric layer 220 (e.g., a high-k dielectric layer) covering the entire semiconductor structure is formed; then, a metal layer (e.g., a Vt tuning metal layer) is deposited on the gate dielectric layer 220 to form a gate metal layer 230. Planarization is carried out so that the upper surface of the metal layer 230 in the trench is flushed with the upper surface of the second dielectric layer 160, as shown in FIG. 15, FIG. 16, and FIG. 17. The metal layer on other regions except the trench is removed. The high-k dielectric may be, for example, one of HfAlON, HfSiAlON HfTaAlON HfTiAlON, HfON, HfSiON, HfTaON, HfTiON, or any combination thereof, and preferably HfO$_2$. The gate dielectric layer 220 may have a thickness of 2 nm to 4 nm, for example, 2 nm, 3 nm or 4 nm. The gate dielectric layer 220 can be formed by processes such as thermal oxidation, chemical vapor deposition, atomic layer deposition, etc. The metal layer may be one of TaN, TaC, TiN, TaAlN, TiAlN, MoAlN, TaTbN, TaErN, TaYbN, TaSiN, HfSiN, MoSiN, RuTax, NiTax, or any combination thereof.

In other embodiments, thermally oxidized gate dielectric layer and polysilicon gate can also be formed.

In the quasi-nanowire transistor and the method for manufacturing the same provided in the present invention, source/drain regions are firstly formed and then a quasi-nanowire fin is formed, which can effectively control the gate length characteristics such as gate length and alignment of the bottom and the top, etc. Furthermore, the high-k gate dielectric and the metal gate are integrated into the fin quasi-nanowire field effect transistor to reduce the short channel effect of the device, thereby facilitating improvement of the performance of the semiconductor device. Furthermore, the strained source/drain regions formed depending on device types may apply different stress to the quasi-nanowire fin according to the device types, thereby increasing the mobility of the channel carrier.

The preferred structure of the semiconductor structure provided in the present invention is summarized as follows.

A quasi-nanowire transistor, comprising:

an SOI substrate, comprising an SOI layer 130, a BOX layer 120 and a substrate layer 100;

a fin, formed by a portion of the SOI layer 130 and at least one silicon/silicon-germanium stack thereon;

source/drain regions 110 located on both sides of the fin and extending in the width direction of the fin, the fin being located in the trench formed by the extended source/drain regions, wherein a spacer 210 is formed on the portion of the source/drain regions 110 unconnected to the fin;

a gate dielectric layer 220 covering the fin; and a gate metal layer 230 covering the gate dielectric layer 220.

The SOI substrate is a three-layer structure, which including a substrate layer 100, a BOX layer 120 on the substrate layer 100, and an SOI layer 130 covering the BOX layer 120, respectively. The material of the BOX layer 120 may be SiO$_2$. The material of the SOI layer 130 is a monocrystalline silicon, germanium or Group III-V compound (such as silicon carbide, gallium arsenide, indium arsenide or indium phosphide, etc.). The SOI substrate in the present embodiment is one having an ultrathin SOI layer 130. Thus, the thickness of the SOI layer 130 can be in the range of 5 nm to 20 nm, for example, 5 nm, 13 nm or 20 nm.

The source/drain regions 110 are located on the SOI layer 130, and may be slightly higher than the upper surface of the third dielectric layer 140. For PMOS devices, the material of the source/drain regions 110 may be $Si_{1-x}Ge_x$ (X may range from 0.15 to 0.75, and can be flexibly adjusted according to process requirements, such as 0.15, 0.3, 0.4, 0.5 or 0.75. The values of X may be determined as described above if not indicated otherwise, and detailed description thereof is omitted herein). For NMOS devices, the material of the source/drain regions 110 may be Si:C (the percentage of the number of C atom may be 0.5% to 2%, such as 0.5%, 1% or 2%, and the content of C atom can be flexibly adjusted according to process requirements. The percentage of the number of C atoms may be determined as described above if not indicated otherwise, and detailed description thereof is omitted herein). The stress material source/drain regions 110 may further adjust the stress within the channel region so as to enhance the mobility of the carrier within the channel region.

The second dielectric layer 160 is located on the source/drain regions 110, and the material of the second dielectric layer 160 may be SiO$_2$.

The spacer 210 is located on both sides of the source/drain regions 110 for separating the source/drain regions 110 from the gate stack formed thereafter, and therefore may have a height at least higher than the source/drain regions 110. The spacer 210 can be formed of silicon nitride, silicon oxide, silicon oxynitride, silicon carbide, or any combination thereof, and/or other suitable materials. The spacer 210 may be a multilayer structure. The thickness of the spacer 210 may range from 5 nm to 10 nm, for example, 5 nm, 8 nm, or 10 nm.

The fin includes an SOI layer 130 and a first silicon-germanium layer 310 thereon, a first silicon layer 320, a second silicon-germanium layer 330, a second silicon layer 340 and a third dielectric layer 140 of a thin oxygen layer, wherein the cross-section of the fin is serrated, i.e., the silicon layers are etched along the {111} crystal plane. The material of the thin oxygen layer is SiO$_2$. The thickness is between 2 nm and 5 nm, e.g., 2 nm, 4 nm, or 5 nm.

The first silicon-germanium layer 310 and the second silicon-germanium layer 330 have a thickness in the range of 1 to 3 nm, wherein germanium has a percentage of 5%-10% in the silicon-germanium material. The first silicon layer 320 and the second silicon layer 340 may have a thickness in the range of 5 to 20 nm.

The gate dielectric layer 220 (e.g., a high-k dielectric layer) covers the fin. The high-k dielectric may be, for example, one of HfAlON, HfSiAlON HfTaAlON HfTiAlON, HfON, HfSiON, HfTaON, HfTiON, or any combination thereof, and preferably HfO$_2$. The gate dielectric layer 220 may have a thickness of 2 nm to 4 nm, for example, 2 nm, 3 nm or 4 nm.

The gate metal layer 230 (for example, a Vt tuning metal layer) covers the BOX layer 120, the spacer 210 and the fin. The gate metal layer 230 may include one of TaN, TaC, TiN, TaAlN, TiAlN, MoAlN, TaTbN, TaErN, TaYbN, TaSiN, HfSiN, MoSiN, RuTax, NiTax, or any combination thereof.

While the exemplary embodiments and advantages thereof have been described in detail, it should be understood that various changes, substitutions and modifications can be made to these embodiments without departing from the spirit of the invention and the scope defined by the appended claims. For other examples, those skilled in the art should readily understand that the order of process steps can be varied while maintaining the scope of the present invention.

In addition, the range of applications of the present invention is not limited to the processes, institutions, manufacturing, composition of matter, means, methods and steps of the embodiments described in the description. In accordance with the disclosure of the present invention, those skilled in the art may readily understand that as for the processes, institutions, manufacturing, composition of matter, means, methods, or steps currently existing or to be developed later in which they implement substantially the same function or achieve substantially the same result as the corresponding embodiments descried in the present invention, they can be applied in accordance with the present invention. Accordingly, the appended claims of the present invention seek to include these processes, institutions, manufacturing, composition of matter, means, methods, or steps within the scope of its protection.

The invention claimed is:

1. A quasi-nanowire transistor, comprising:
    a SOI substrate comprising a SOI layer (130), a BOX layer (120) and a substrate layer (100);
    a quasi-nanowire fin which has serrated sidewalls formed by a portion of the SOI layer (130) and at least two silicon/silicon-germanium stacks thereon; and, in the silicon/silicon-germanium stack, the silicon-germanium layer is formed on the silicon layer;
    source/drain regions (110) located on both sides of the fin and extending in the longitudinal direction, the fin being located in a trench formed by the extended source/drain regions, wherein a spacer (210) is formed on a portion of the source/drain regions (110) unconnected to the fin;
    a gate dielectric layer (220) covering the fin; and
    a gate metal layer (230) covering the gate dielectric layer (220).

2. The quasi-nanowire transistor according to claim 1, wherein the top of the fin is covered with a third dielectric layer (140).

3. The quasi-nanowire transistor according to claim 1, wherein the source/drain regions (110) are covered with a second dielectric layer (160).

4. The quasi-nanowire transistor according to claim 1, wherein the source/drain regions (110) are stress material source/drain regions.

5. The quasi-nanowire transistor according to claim 4, wherein the transistor is PMOS, the material of the source/drain regions (110) is SiGe, and the ratio of Ge element is within the range of 15%-75%.

6. The quasi-nanowire transistor according to claim 4, wherein the transistor is NMOS, the material of the source/drain regions (110) is SiC, and the ratio of C element is within the range of 0.5%-2%.

7. The quasi-nanowire transistor according to claim 1, wherein the gate dielectric layer (220) is a high-k dielectric layer and the gate metal layer (230) includes a Vt tuning metal.

8. The quasi-nanowire transistor according to claim 1, wherein the source/drain regions (110) are higher than the fin.

9. The quasi-nanowire transistor according to claim 1, wherein the crystal orientation of the silicon layer surface at the sidewalls of the fin is <111>.

* * * * *